United States Patent [19]
Rivers et al.

[11] Patent Number: 5,170,396
[45] Date of Patent: Dec. 8, 1992

[54] DATA VALID DETECTOR CIRCUIT FOR MANCHESTER ENCODED DATA

[75] Inventors: Brian T. Rivers; Juha H. Tenhunen; Antti Rasanen, all of Oulu, Finland

[73] Assignee: Introtek International, L.P., Deer Park, N.Y.

[21] Appl. No.: 538,395

[22] Filed: Jun. 14, 1990

[51] Int. Cl.⁵ .......................................... H03M 13/00
[52] U.S. Cl. ...................... 371/6; 371/25.1; 371/57.2; 375/87
[58] Field of Search .............. 371/6, 25.1, 57.2, 57.1, 371/48; 341/70; 375/110, 116, 87

[56] References Cited

U.S. PATENT DOCUMENTS

| | | | |
|---|---|---|---|
| 3,480,910 | 11/1969 | Brenza et al. | 371/6 |
| 3,626,298 | 12/1971 | Paine et al. | 178/69.5 |
| 3,836,956 | 9/1974 | Cross | 371/57.1 |
| 4,029,905 | 6/1977 | Abraham | 178/88 |
| 4,109,236 | 8/1978 | Besenfelder et al. | 371/6 |
| 4,160,240 | 7/1979 | Partipilo | 371/29.1 |
| 4,189,622 | 2/1980 | Foshee | 178/69.1 |
| 4,358,846 | 11/1982 | Morgan | 371/6 |
| 4,764,923 | 8/1988 | Forth et al. | 371/6 |
| 4,815,107 | 3/1989 | Kishimoto et al. | 371/6 |
| 4,932,036 | 6/1990 | Goradia | 375/1 |

Primary Examiner—Robert W. Beausoliel
Assistant Examiner—Ly V. Hua
Attorney, Agent, or Firm—Marshall, O'Toole, Gerstein, Murray & Bicknell

[57] ABSTRACT

A data valid detector circuit for Manchester encoded data monitors two parameters to determine single bit validity, namely, the location and number of edges in one bit period, and the output count of an integrator type Manchester decoder circuit. Circuits analyze each received bit waveform to see that the data falls within reasonable limits of what can be said to be a valid Manchester bit. By retaining bit-by-bit information on validity for a sample of N bits, a determination is made of the validity of this string of N bits. A data valid signal is then generated indicating reception of a usable signal, even when disturbed by noise, if a sufficient number of bits in the string are valid.

27 Claims, 11 Drawing Sheets

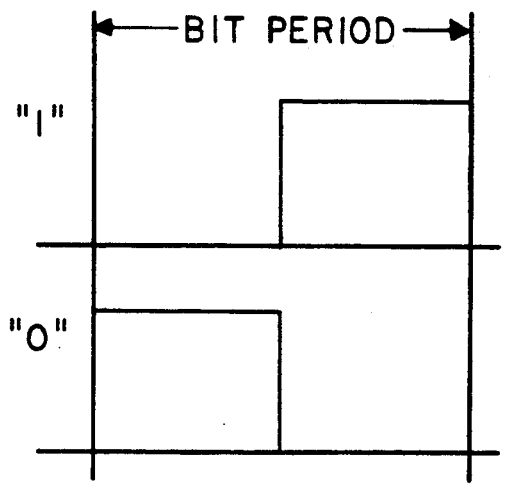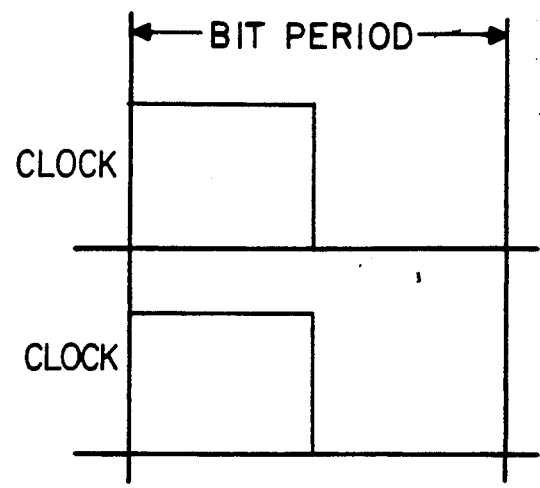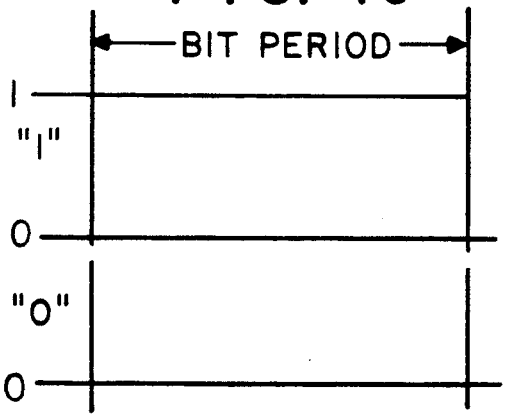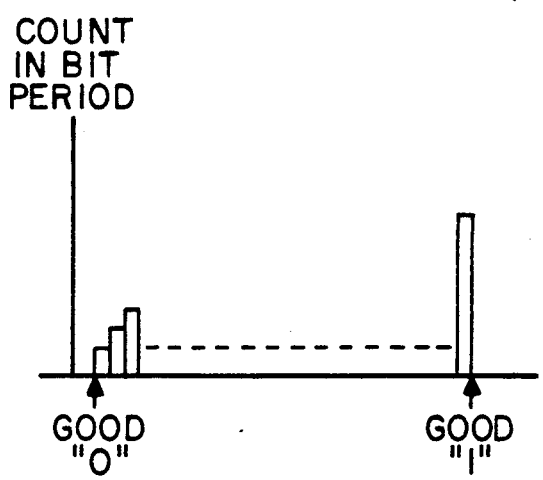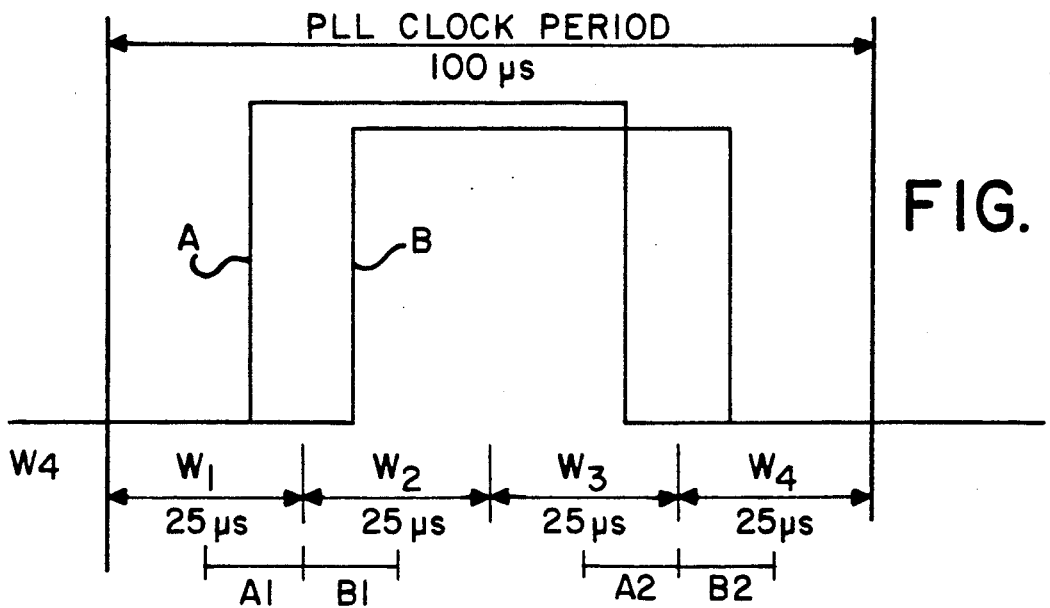

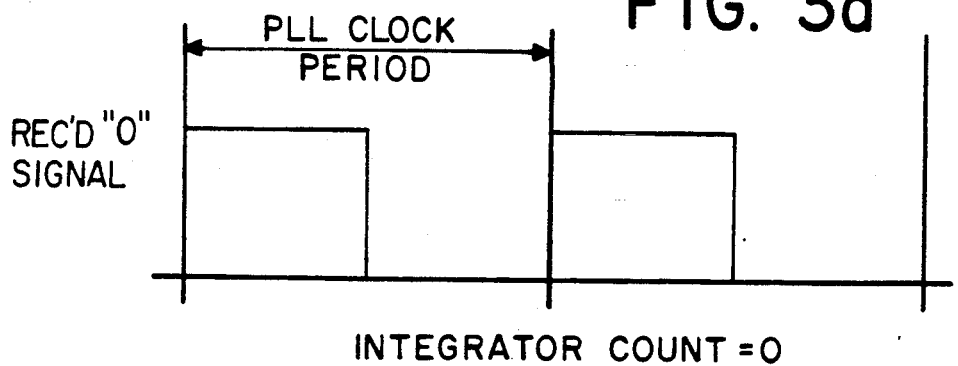
FIG. 3a
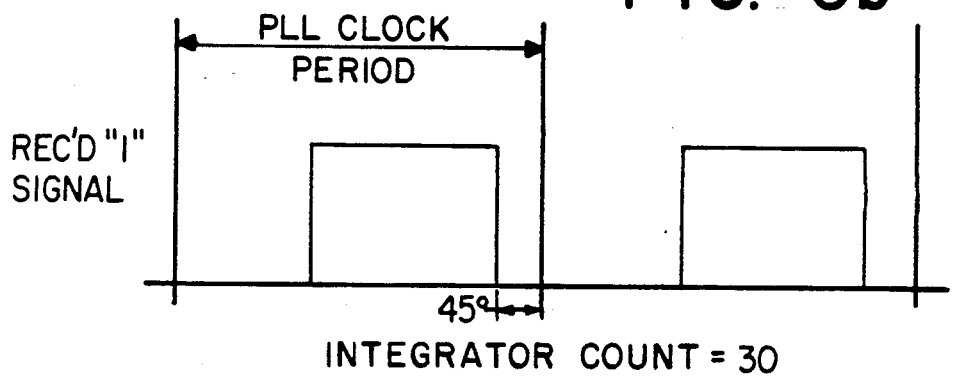
FIG. 3b
FIG. 4
EDGE POSITIONS AND INTEGRATOR COUNTER OUTPUTS
|  | $W_1$ | $W_2$ | $W_3$ | $W_4$ | INTEGRATOR COUNT 1 SENT | 0 SENT |
|---|---|---|---|---|---|---|
| VALID | 1 | 0 | 1 | 0 | > 20 | < 20 |
|  | 0 | 1 | 0 | 1 | > 20 | < 20 |
|  | 0 | 1 | 0 | 0 | > 30 | < 10 |
|  | 0 | 0 | 1 | 0 | > 30 | < 10 |
|  | 1 | 1 | 0 | 0 | > 20 | < 20 |
|  | 0 | 0 | 1 | 1 | > 20 | < 20 |
|  | 1 | 1 | 0 | 1 | > 30 | < 10 |
|  | 1 | 0 | 1 | 1 | > 30 | < 10 |
| INVALID | 0 | 0 | 0 | 0 |  |  |
|  | 1 | 0 | 0 | 0 | 20-30 | 10-20 |
|  | 0 | 0 | 0 | 1 | 20-30 | 10-20 |
|  | 1 | 0 | 0 | 1 | 0-30 | 10-40 |
|  | 0 | 1 | 1 | 0 | 0-30 | 10-40 |
|  | 1 | 1 | 1 | 0 | 0-30 | 10-40 |
|  | 0 | 1 | 1 | 1 | 0-30 | 10-40 |
|  | 1 | 1 | 1 | 1 | 0-30 | 10-40 |

| W1 | W2 | W3 | W4 | L10G30 | BV |
|---|---|---|---|---|---|
| 0 | 0 | 0 | X | X | 0 |
| 0 | 0 | 1 | X | 0 | 0 |
| 0 | 0 | 1 | X | 1 | 1 |
| 0 | 1 | 0 | 0 | 0 | 0 |
| 0 | 1 | 0 | 0 | 1 | 1 |
| 0 | 1 | 0 | 1 | X | 1 |
| 0 | 1 | 1 | X | X | 0 |
| 1 | 0 | 0 | X | X | 0 |
| 1 | 0 | 1 | 0 | X | 1 |
| 1 | 0 | 1 | 1 | 0 | 0 |
| 1 | 0 | 1 | 1 | 1 | 1 |
| 1 | 1 | 0 | X | 0 | 0 |
| 1 | 1 | 0 | X | 1 | 1 |
| 1 | 1 | 1 | X | X | 0 |

DATA VALID DETECTOR CIRCUIT FOR MANCHESTER ENCODED DATA

BACKGROUND OF THE INVENTION

This invention relates generally to data signal detectors and, more particularly, to an improved method and apparatus for detecting the validity of a data signal transmitted on a noisy communication channel, which may also transmit speech on a time-shared basis. Such channels are found in some mobile and portable radio telephone communication systems.

Frequently mobile radio telephone systems, particularly cellular radio telephone systems, have the data in the form of Manchester encoded signals. With Manchester encoded signals, a 1 bit is indicated by a rising pulse edge at the center of a bit period and a 0 bit is indicated by a falling edge at the center.

Manchester encoded data is usually made up of data frames. Each data frame includes in series a bit stream of alternating ones and zeros called a "dotting pattern", a synchronization word, sometimes called a "Barker word", and finally a stream of data forming a data word. The total frame may last, for example, 100 microseconds. After the data frame passes, a speech signal may occur or the data frame may be repeated.

When receiving and decoding Manchester encoded data that is mixed in with voice signals on a time share basis, it is necessary to have a signal that indicates whether or not the received signal is valid data. A "data valid" signal can be generated by detecting the receipt of the dotting pattern or the Barker word. For example, a tone detector can be used to detect the dotting pattern. If the bit frequency of the data signal is 10 KHz, then a 5 KHz tone detector can be used to detect the 101010.. dotting pattern that starts data transmission, because the signal has edges only at the bit period centers and hence is really a 5 KHz signal. Such a solution to the problem data detection requires analog circuitry to implement it, which circuitry is generally difficult to design and construct. Also this technique is not accurate because voice signals or noise can sometimes have the same pattern as the dotting pattern.

A sync signal detector looks for a unique combination of bits. The received signal is decoded and compared to the predetermined code or bit combination. When this code combination is found, it is assumed that valid data has been located. Like dotting pattern detection, sync word detection can give false indications that the start of a data frame has occurred when the speech or noise randomly produce the required pattern for a sync word.

In prior art systems, the detection of a dotting pattern and sync word create a signal which indicates to the system processor that a data frame is being received. In response, the received signal is sent to the processor which then checks the data bit-by-bit using its internal program.

An integrator method can be used to process incoming Manchester signals to determine single bit validity. In such a circuit, a received signal is applied to one input of an Exclusive-OR circuit and a clock signal from a phase-locked loop is applied to the other input. If the signal contains valid Manchester data, the output of the Exclusive-OR circuit will remain high, if the received bit is a 1, and will remain low, if the receive bit is 0. The output signal of the Exclusive-OR circuit is then integrated. For example, this signal is used to enable a digital counter synchronized to the beginning of the bit period and clocked at a frequency F, which is many times, e.g. 40 times, the data bit rate. The counter should count to F when a 1 signal is received from the Exclusive-OR circuit and should count to 0 when a 0 signal is received, provided the data is perfectly received. When there is noise or shifting of the data edges, the count from the counter will be somewhere between 0 and F. If the count is below a preset value, the data is declared a valid 0 and if it is above a preset value, it is declared a valid 1.

In a prior art decoder where F=40, a limit for the count was set at 20, with a count greater than 20 indicating a 1 signal and a count less than 20 indicating a 0 signal. A major problem with such an integrator method is that the integrator counter circuit output indicates nothing about the appearance of the received wave form. Without tracking the location of the edges of the received signal, it is only possible to make a reasonable estimation as to the validity of the signal which the integrator has decoded.

In using the tone detector method for recognizing the dotting pattern and the integrator method for determining if a bit is valid, a period of time must elapse before the processor can determine if it is actually decoding a data frame. Depending on the limit set in the system, it is possible that the processor will not determine that the signal it is decoding is not a data frame soon enough to reset and then capture the actual data frame. In such a case the circuit may actually miss validly transmitted data.

Another problem exists in these systems when speech and data transmission share the same channel. It is desirable to separate the speech and data signals so that the data signal is not heard at the receiver. Thus, during the time period when a data frame is received, the processor mutes the audio in the headphone or speaker of the receiver. However, this cannot be done if false data detection occurs.

To overcome some of the problems of false detection, more sophisticated techniques are used. These techniques generally involve correlating the occurrence of a dotting pattern and/or Barker word to particular time periods and correlating the sequences that these signals occur in to that expected for valid data. U.S. Pat. No. 4,312,074 describes a method and apparatus for detecting a data signal, including repeated data words, which are mixed in with noise or a speech signal. The patent describes a program solution for microprocessors that uses a complicated algorithm to determine if valid data is being received. According to this system, upon the detection of each Barker word, the microprocessor stores the following data word and measures the elapsed time interval between data words by measuring the time between the detection of Barker words. The elapsed time interval is added to the stored time interval of all previously received data words. If at least 3 of the received data words have corresponding stored time intervals that are correlated with predetermined time interval ranges, a correlation indication signal is provided to indicate that valid data words have been received.

It can be seen that the prior art data valid detector circuits for Manchester encoded data either function poorly in the presence of noise or speech signals, or are extremely complicated. Thus, it would be beneficial to have a data valid detection circuit for Manchester encoded data that rapidly and accurately determines if valid data signals are being received, is simple in construction and operates accurately in the presence of noise.

SUMMARY OF THE INVENTION

The present invention is directed to providing an improved data valid detector circuit for Manchester encoded data that discriminates between valid data and voice or noise with accuracy and speed, is simple, reliable, and requires little power. This is achieved by detecting not only the existence of the edges of data signals which indicate valid data, but by additionally determining the location and number of such edges in each bit period.

The present data valid detector circuit for Manchester encoded data monitors two parameters to determine single bit validity, namely (1) the location and number of edges in one bit period, and (2) the output count of an integrator type Manchester decoder circuit. These circuits analyze each received bit encoded waveform to see that the data falls within reasonable limits for valid Manchester bits. Also, bit-by-bit information on the validity of a string of N bits is stored, e.g. in a shift register, and is used to determine the validity of the string of bits. A data valid signal is generated indicating reception of a valid Manchester encoded data frame.

In an illustrative embodiment of the invention, the bit period of a received signal is divided into four (4) sections or windows by a multiplexer. Then the occurrence of an edge signal in the windows is checked by an edge detector and four (4) edge counters. Depending on which window or windows the edge occurs in, as indicated by the edge counters, the bit is decoded in a combinational logic circuit as a 1, 0 or invalid data. This combinational logic circuit also receives the output of an integrator circuit in the form of a counter that is enabled by a signal based on an Exclusive-OR combination of the bit clock rate and the received signal. If the counter, for example, is operating on a signal with no noise, the count will be 0 for a 0 bit input and 40 for a 1 bit input. However, in the presence of noise, signals produced with a count of less than 10 are considered 0's and those with a count of more than 30 are considered 1's, but only in combination with the occurrence of the edge in the correct window. The decoded 1's and 0's are accumulated in a shift register and, if it is determined that a sufficient number of valid bits occurred in a particular time period, a signal is generated which indicates that a valid data frame has been received.

BRIEF DESCRIPTION OF THE DRAWINGS

For a fuller understanding of the invention, reference is made to the following detailed description taken in connection with the accompanying drawings, in which:

FIGS. 1a–1d indicate an integration method useful in the present invention for determining whether an incoming signal is a valid bit in Manchester format;

FIG. 2 illustrates a received signal bit period divided into windows in accordance with the invention;

FIGS. 3a and 3b illustrate the effect of signal edge shifting due to noise in accordance with the invention;

FIG. 4 is a truth table which specifies whether the signal in a bit period is valid data based on the location of the signal edge and the integrator count in accordance with the present invention;

DETAILED DESCRIPTION OF THE PREFERRED EMBODIMENTS

Figure 5:
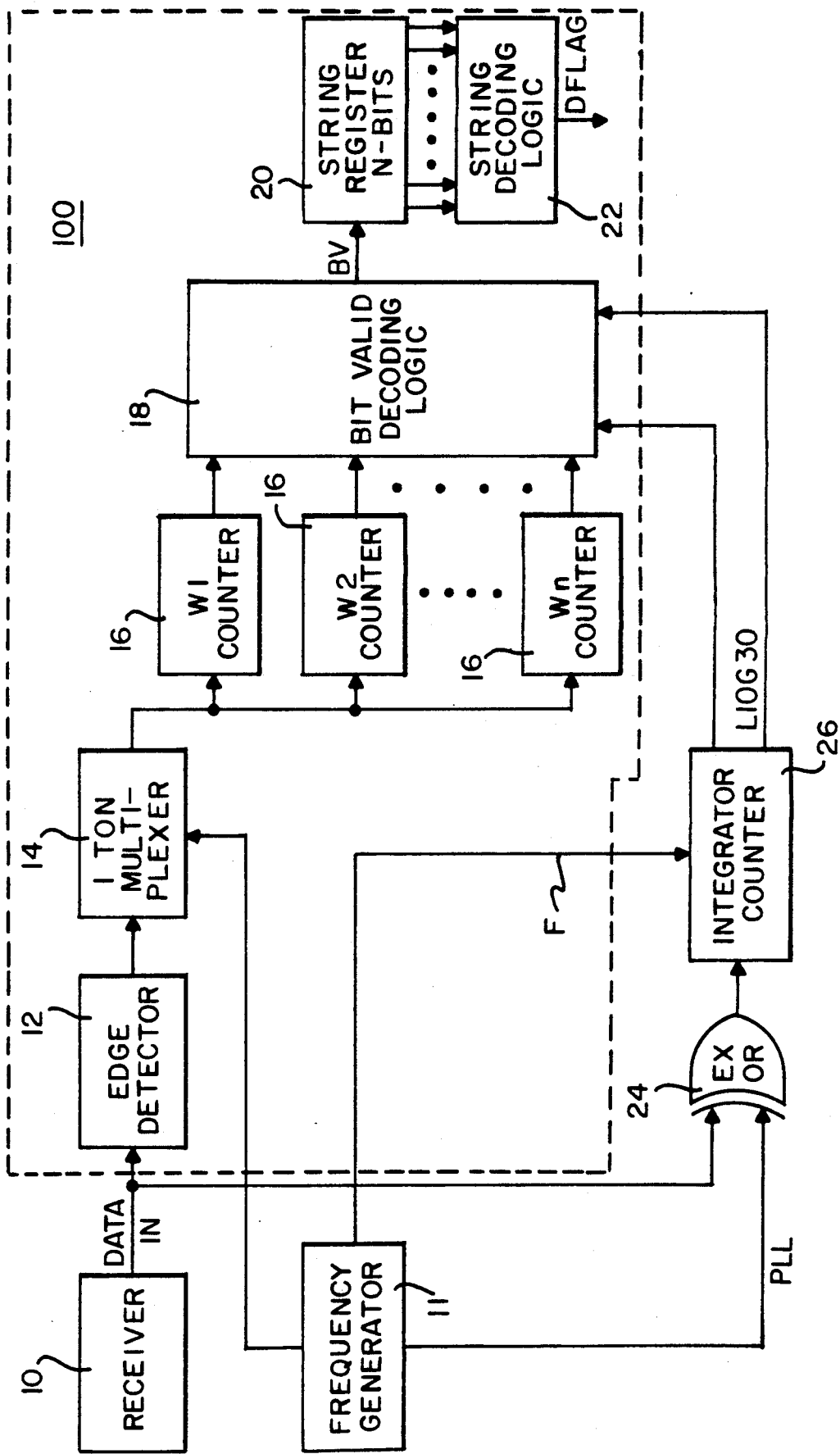
FIG. 5 is a functional block diagram of a data detection circuit for Manchester encoded data in accordance with the present invention.

The data valid detector circuit for Manchester encoded data in accordance with the present invention monitors two parameters to determine single bit validity, namely, (1) the location and number of edges in one bit period and (2) the output count of an integrator type Manchester decoder circuit. FIGS. 1a–1d illustrate the principles of operation of an integrator type decoder. In FIG. 1a a valid 1 bit and a valid 0 bit in Manchester coded data format are shown. In the absence of noise the signal edges occur at the midpoint of the bit period. FIG. 1b shows a clock signal which can be combined in an Exclusive-OR circuit with the 1 and 0 signals to produce the resulting signals in FIG. 1c. If the signal of FIG. 1c is used to enable a counter connected to a signal operating at 40 times the bit rate, the counter will count to 40 when a 1 bit occurs (FIG. 1d) and will count to 0 when a 0 bit occurs. However, in the presence of noise the pulse edge in FIG. 1a occurs away from the midpoint of the bit period or there are many reversals in level.

In FIG. 3a, two 0 pulses following each other are shown. There is no noise and the transistions are at the midpoint. Thus, the integrator count is equal to zero. However, in FIG. 3b two 1 pulses are shown. These pulses have been shifted by about 45 degrees to the left. Instead of the integrator count being 40 for a perfect 1, it is reduced to 30. Thus counts greater than 0 for a 0 bit and less than 40 for a 1 bit will be produced by the integrator counter in the presence of noise. Rather than simply setting predetermined levels, e.g. less than 20 for a 0 bit and more than 20 for a 1 bit, to estimate the bit validity, the present invention makes this determination based on where the edge occurs in the bit period, as well as the value of the integrator count.

In order to determine the location and number of edges in a received waveform, the bit period is divided into windows, as illustrated in FIG. 2. In FIG. 2, a 100 microsecond bit period (for example) is divided into four time windows, $W_1$, $W_2$, $W_3$ and $W_4$ of 25 microseconds each. A larger number N of windows will give a more accurate result, but requires more sophisticated circuitry to implement.

In FIG. 2 waveform A provides edges in $W_1$ and $W_3$. This is the format for a "1" bit shifted to the left, or a "0" bit shifted to the right in FIG. 1a. If the integrator counter also provides a count greater than 20, a 1 bit can be presumed. Should the count be less than 20, a 0 bit can presumed. If the shift is up to 90°, the same conclusion can be drawn from the occurrence of edges in $W_2$ and $W_4$ as shown by waveform B. By making similar analyses, we can arrive at a truth table for validating and decoding signals based on which windows the edges occur in and the value of the integrator counter. Such a table is shown in FIG. 4 with the first two lines representing the immediately preceding discussion.

The window size, number of edges allowed in each window, and the final determination of a 1 signal or 0 signal should take into account the fact that the integrator counter tolerates up to a total 90° shift in all of the edges while still correctly validating and decoding a received signal. In particular, if the edges are in certain positions, a valid signal is properly interpreted, provided that the total shift of all edges is not greater than 90° (FIG. 3b).

FIG. 4 illustrates, for four windows, the integrator count results and the different possible window locations of the shifted edges. The fact that the number of edges in a window depends on whether a 1 or 0 follows or precedes the bit in question is taken into account in FIG. 4. Sixteen possible combinations of edge locations are illustrated along with associated integrator counts. The results in the following example and in FIG. 4 are based on an integrator counter clock rate at 40 times the bit rate, i.e. the maximum possible count in a bit period is 40 for reception of a perfect 1 bit.

For this four window example, a count greater than 30 for a 1 and less than 10 for a 0, with edges located as indicated in the table (FIG. 4) for the first eight rows from the top of the table, indicates a correctly decoded bit when a signal is being received. For the next eight rows, the edge positions indicate that the signal has been shifted more than 90° or has been invalidated by interference. The count in these cases could be anywhere from 0 to 40 and, if used as the sole criterion, could wrongly indicate valid data. The edge locations here reveal that the signal is not valid. Such edge location combinations can not occur with valid data unless interference is also present. This shows that the count value alone is not sufficient to make a correct determination of bit validity.

A representative block diagram for a data detector circuit for Manchester data in accordance with the invention is illustrated in FIG. 5. This circuit examines W windows for each bit, decodes the information, stores the bit-by-bit result in an N-bit shift register and decodes the contents of the N-bit register to generate a data-valid signal, if appropriate. According to need, the signal generated for each window can be an x-bit signal, where x is one or more integers.

The circuit of FIG. 5 includes a receiver 10, a data valid detector circuit 100 (in dotted line), a frequency generator 11 and an integrator circuit with its associated Exclusive-OR gate 24. With more particularity, the general block diagram of FIG. 5 includes an edge detector 12 that receives the incoming signal from the receiver 10, e.g. the receiver circuits of a mobile cellular telephone. Pulses indicating edge transitions are produced in detector 12 and sent to a multiplexer 14. The multiplexer 14 successively connects its input to its output lines in response to a clock signal from generator 11, which clock signal is n times the bit rate, where n is the number of windows in a bit period. As a result, in each bit period the multiplexer directs the edge pulses from detector 12 to one of the edge counters 16 depending on which one is selected at the time the pulse occurs, i.e. depending upon the window W in which an edge is detected. The outputs of the edge counters 16 are high or low depending the number of edges detected in the particular window. These edge counter outputs are applied to a bit validity decoding logic circuit 18 that, in accordance with a predetermined truth table such as FIG. 4, decides whether the received data in that bit period is a valid Manchester bit, regardless of whether the data is a 1 or a 0.

The output, valid or invalid, of the logic circuit 18 is input to a shift register 20 that holds N-bits. Another logic circuit 22 generates a "data valid" signal indicating that the data being received appears valid in accordance with predetermined standards. These standards specify how many bits in the bit register 20 must be valid to initiate a data valid signal, and when such a data valid signal is discontinued in view of a determination that a sufficient number of invalid bits have been received.

In performing the analysis based on edge quantity and location, the bit decoding logic circuit 18 receives an additional input from the integrator that indicates whether the integrator count was above or below a predetermined limit.

As stated above, the received signal is applied to an Exclusive-OR circuit 24 along with a bit rate clock signal from generator 11 that is synchronized with the beginning of the bit period. The output of circuit 24 enables an integrator counter circuit 26 during the bit time period. A signal F with a frequency (for example) 40 times the bit rate is counted in circuit 26 whenever it is enabled by the signal from Exclusive-OR gate 24. As a result, the count in integrator counter circuit 26 is a second indication of whether the bit is a 1 or a 0. This indication can be used in logic circuit 18, along with the information on which of the windows W had the edges, to create a bit valid, BV, signal.

By setting a limit M as the number of bits which must be valid out of a word of length N as the criteria to indicate detection of a valid data signal, a quick determination can be made that actual data is being sent. This is accomplished by storing the bits (valid, not valid) in string register 20 and decoding them in logic circuit 22, the output of which is the data valid signal, DFLAG. After the data has been detected and indicated to be valid, it is monitored bit-by-bit (as the bit stream continues) as it is stored in string register 20 to be sure that the data stays within acceptable limits. In particular, the received bit stream is checked continuously to indicate when the number of good bits received in the latest N bits is below a present limit M2. The valid data signal can then be set low when this condition is detected, to indicate unacceptable data.

Figure 6:
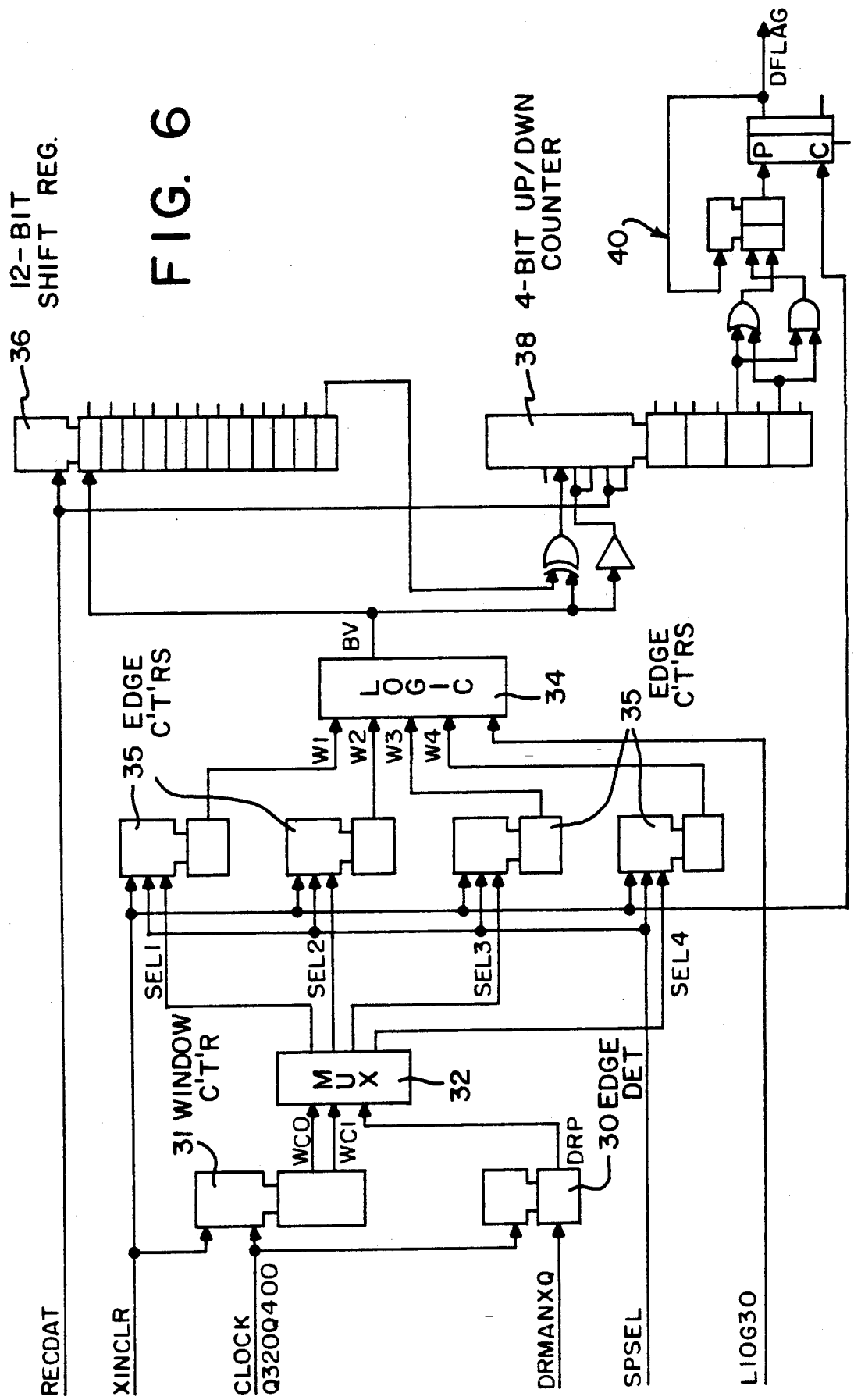
FIG. 6 is a general schematic and block diagram of the data valid circuit of the data detector of FIG. 5 in accordance with the invention.

A more detailed block diagram of the data valid detector circuit 100, of the data detector of FIG. 5, is shown in FIG. 6. The window counter 31 of FIG. 6 is a 6-bit counter which counts the rising edges of a clock signal which, for example, is four times the bit rate, so as to create four windows. The outputs of the window counter 31 are WC0 and WC1. The counter indicates which of the windows in FIG. 2 is being examined for edges. The input clock and the size of the counter 31 are designed so that in a clock period of x seconds, the outputs WC0, WC1 are 0,0 for the first x/4 seconds, 0,1 for the second x/4 seconds, 1,0 for the third x/4 seconds and 1,1 for the fourth x/4 seconds. This gives four windows of equal length. When the bit period is 100 microseconds, each window will be 25 microseconds in length as shown in FIG. 2. Other window spacing, including windows of unequal size, can be employed, if desired to improve valid data detection.

The outputs of the window counter 31 select which edge counter 35 will be used to count the rising or falling edges of the received data signal DRMANXQ and indicate in which window these edges are found. This is achieved because the outputs of the window counter 31, i.e. WC0 and WC1, provide a path from the input of a multiplexer 32 to one of its outputs, i.e. SEL1, SEL2, SEL3 and SEL4.

An edge detector 30 generates a pulse DRP of the same period as its clock signal (Q320Q400) whenever the incoming data signal (DRMANXQ) switches from high to low or low to high. This DRP pulse is directed from the edge detector 30 to the multiplexer 32 input. The edge signal DRP is then directed to one of the four edge counters 35 through the multiplexer 32. In particular, the multiplexer 32 directs DRP to SEL1 when the window counter outputs (WC0, WC1) are 0,0, to SEL2 when WC0, WC1 are 0,1, to SEL3 when WC0, WC1 are 1,0 and to SEL4 when WC0, WC1 are 1,1. When not selected the SEL outputs are low.

The four edge counters 35 take care of the edge counts for respective ones of the four windows. When the window counter 31 has selected a certain window, i.e., by routing DRP through the multiplexer 32 to that window, a pulse on line DRP will cause the selected edge counter 35 for that window to indicate the status of the edge count. The edge counters also receive a spike select signal (SPSEL). This signal is used to set the circuit for the types of edges that are taken as valid. Thus the edge counters operate as follows:

A. When the signal SPSEL is low, one pulse within the time window causes the window counter output Wx (x=window number) to be high, and no pulse or more than one pulse within the time window causes the output Wx to be low; and B. When SPSEL is high, an even number of pulses within the window causes Wx to be low, and an odd number of pulses within a window causes Wx to be high.

Thus when SPSEL is at a logic 0, one DRP pulse in a window is taken as a valid edge, zero pluses are, of course, considered no edge and more than one pulse in a window is considered to be invalid data, i.e. a noise spike. In particular, a data edge is assumed to have occurred in a certain window when SPSEL is 0, if and only if, a single edge occurs in that window.

If SPSEL is at logic 1, the occurrence of zero or an even number of edges are not taken as valid edges. If an odd number of edges occur, it is assumed that two or an even number of edges belong to a spike and the single odd edge is a data signal edge in the window. This assumes that spikes will be short.

Figures 7, 8A:
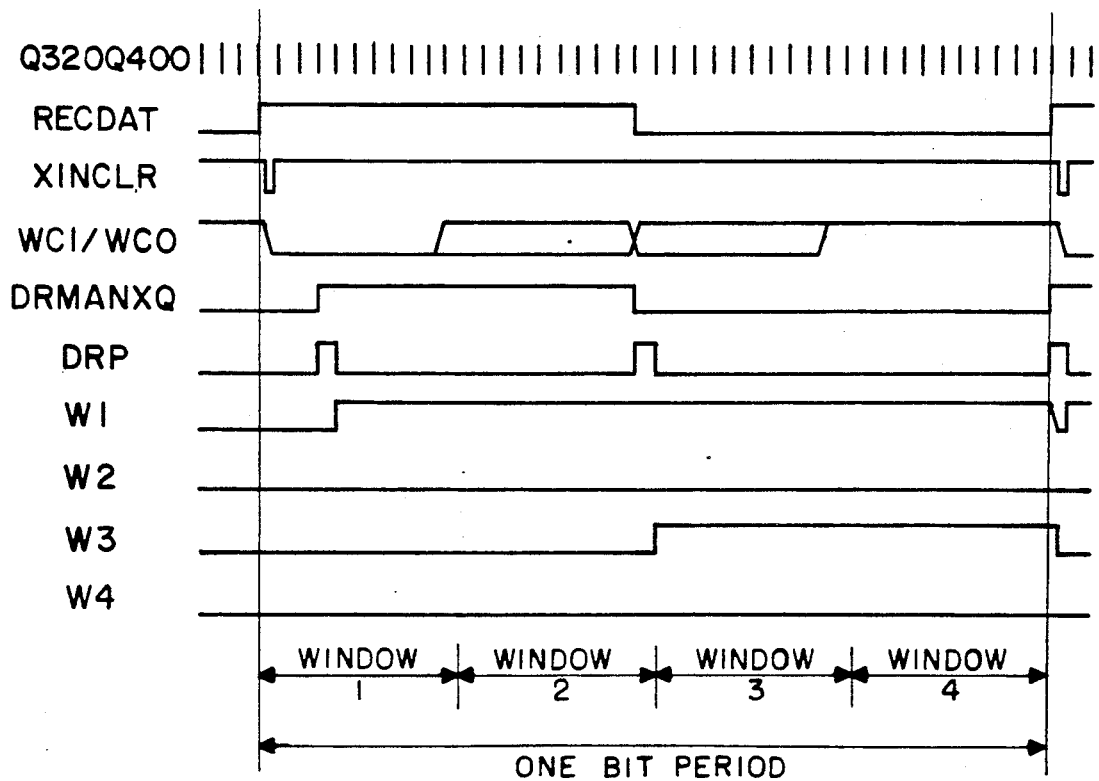
FIG. 7 is a truth table for decoding the validity of an incoming signal in the circuit of FIG. 6.
FIGS. 8a and 8b illustrate waveforms at various points in the circuit of FIG. 6.

The decoder logic 34 in FIG. 6 produces the bit valid signal, BV, at the end of each bit period based on the four edge counter outputs W1-W4 and a signal L10G30, according to the truth table in FIG. 7. The signal L10G30 indicates that the integrator count is less than 10 or more than 30. This signal is obtained from the decoder's integrator counter (not shown in FIG. 6). The integrator counter functions as previously described with an F of 40, i.e., maximum count in a bit period is 40.

Figure 9:
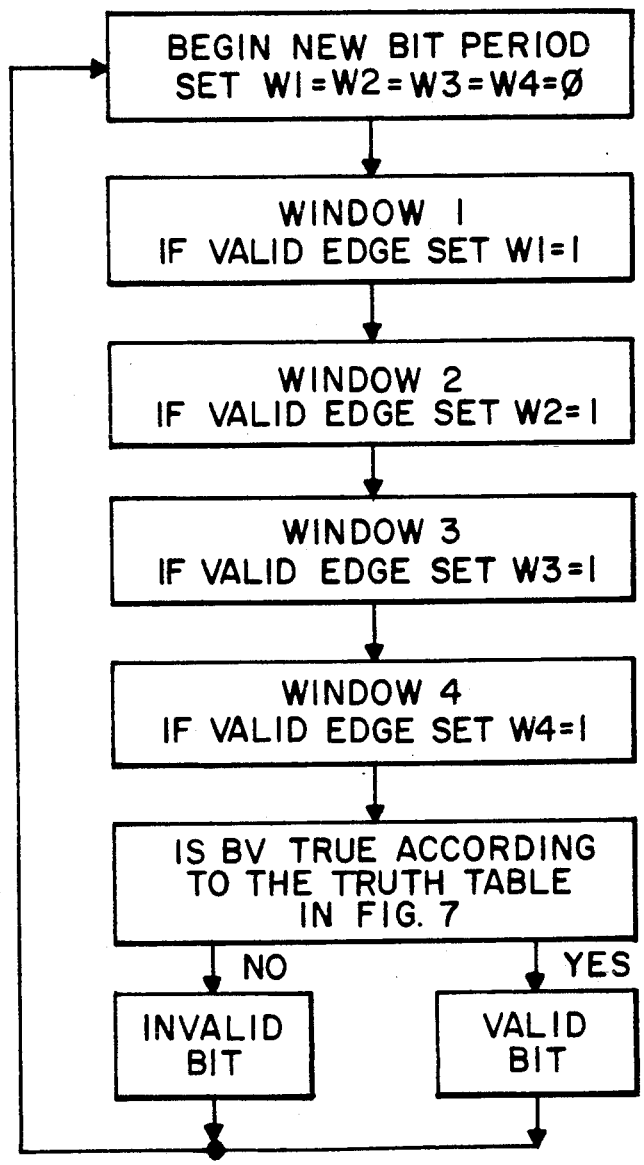
FIG. 9 is a flow chart for determining the validity of a bit in the bit valid detector of FIG. 6.

The single bit signal determination according to the truth table shown in FIG. 7. is controlled by the circuitry according to the process of the flow chart in FIG. 9. The signal is then used by the bit string decoder (FIG. 5) according to the process shown in FIG. 10 to provide a high signal, DFLAG, when valid data is being received.

Generally, if edges are positioned as in the first eight rows of the truth table of FIG. 7 and the count is less than 10 or greater than 30, the bit valid signal is set high. This assumes that the data bit pulse is at least 25 microseconds long. However, two rows in the truth table are exceptions to the less than 10 and greater than 30 count. It appears at first glance that four windows are not necessary since, from FIG. 7, windows W2 and W3 seem to give all of the information necessary to decide on a bit's validity, i.e., one and only one edge in W2 and W3 indicates a valid bit. A few cases were found, however, in which the information from all four windows is needed. FIG. 2 illustrates this condition. FIG. 2 shows the points at which an edge A in both W1 and W3 or an edge B in both W2 and W4 can possibly cause the integrator count to be between 20 and 30. This count could result from a valid bit that has been shifted. By allowing the data-valid circuit to change the limits, that is, to be greater than 20 (instead of 10) for a 1, and less than 20 (instead of 30) for a 0, the four window circuit can detect these W1/W3 and W2/W4 conditions correctly. This is the only condition for which it is necessary to change the limits on the counter to improve evaluations of bit validity.

The 12 bit shift register 36 in FIG. 6 is used to store the twelve latest bit validity values, BV. These stored values of validity or invalidity are clocked into the shift register at the end of each bit period by a clock signal, RECDAT.

Figure 10:
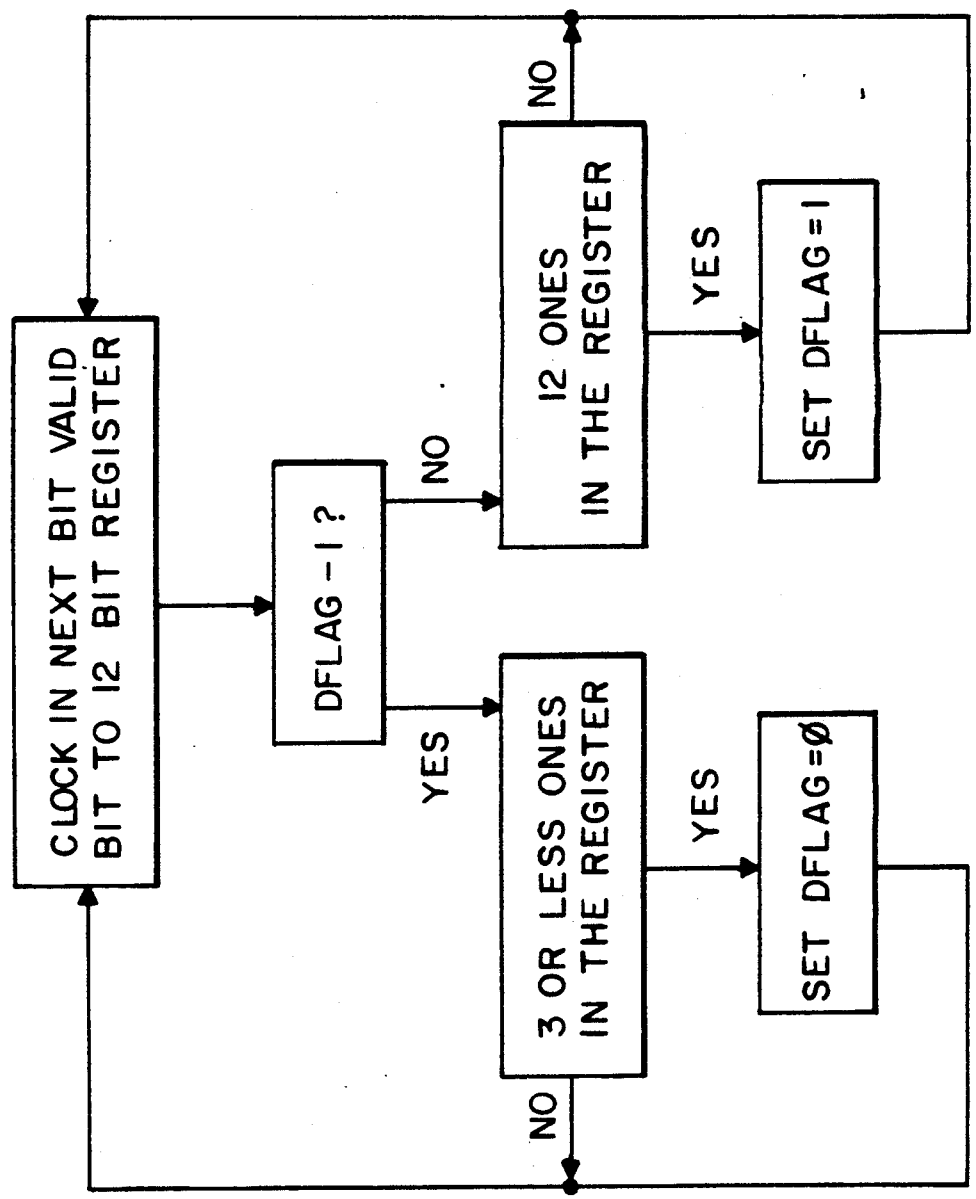
FIG. 10 is a flow chart for a determining the validity of a string of bit values for the circuits of FIGS. 5 and 6.

The 4 bit up/down counter 38 and DFLAG decoder 40 are used along with the 12 bit shift register 36 and the BV signal to realize the flow-chart logic shown in FIG. 10 for valid data detection. The DFLAG signal is the output of this block and, for example, synchronizes other circuits (not shown) to mute the audio and process the incoming data frame so long as DFLAG remains high.

Thus, for the particular circuit configuration of FIG. 6, the bit validity is checked at the end of each 100 microsecond period by decoding W1, W2, W3 and W4 according to the truth table of FIG. 7. For each bit, the evaluation signal is stored in the 12-bit register 36 as the latest bit-valid value. The register contents are then continuously decoded for every bit period by a decoder 22 (FIG. 5) and/or circuits 38, 40 in FIG. 6.

Before word sync detection, twelve out of twelve bits must be good to set DFLAG high as shown in FIG. 10. After the sync word has been detected and DFLAG is high, more than three bit values in the 12-bit register must remain high to keep DFLAG high. Counting of these bit values is accomplished in counter 38 and detected in decoder 40.

FIG. 8a is a pulse diagram of a bit period showing the time relationship between input and internal signals in the circuit of FIG. 6 leading to the outputs of the edge counters 35. In this example, a DRMANXQ edge (incoming received signal) in windows 1 and 3 results in W1 and W3 going high. These signals are then used by the bit decoder logic 34 at the end of the bit period. The RECDAT signal (which is a phase-locked loop generated synchronized clock signal) is used to clock the bit valid, BV, signals into the 12-bit shift register 36. The XINCLR signal clears the edge counters 35 and edge detector 30, and clocks out the newly decoded data valid signal, DFLAG.

Figure 8B:
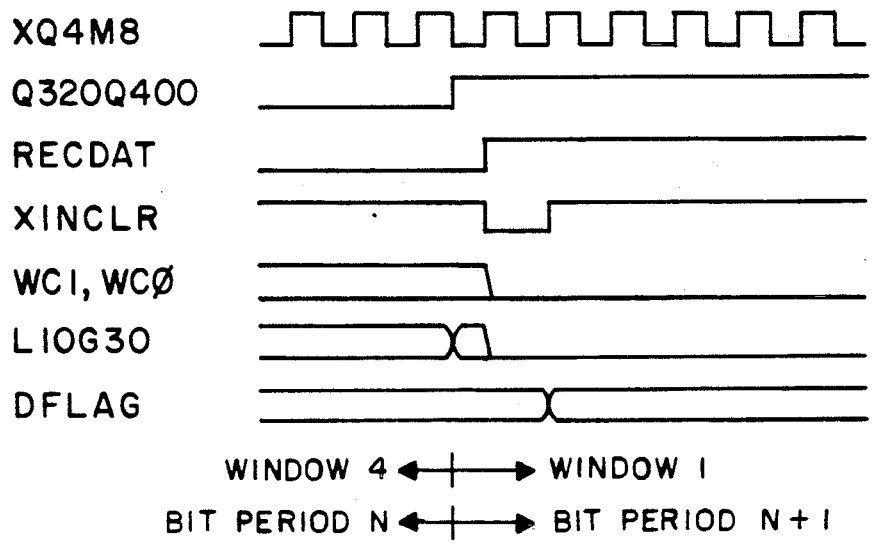

FIG. 8b shows waveform changes that occur when the circuit is changing from window 4 of bit period N to window 1 of bit period N+1. The relationships of the Q320Q400 clock, RECDAT and XINCLR are set by circuitry outside of the data-valid circuit, which is not shown.

Test measurements on a circuit designed as described above show that when good Manchester data is being received and the radio frequency signal level is over 115 dbm, DFLAG will stay high. When the radio frequency signal is below that range, DFLAG goes low to indicate that the data may not be correctly decoded. This level can be changed by varying the circuit parameters.

Figure 11A:
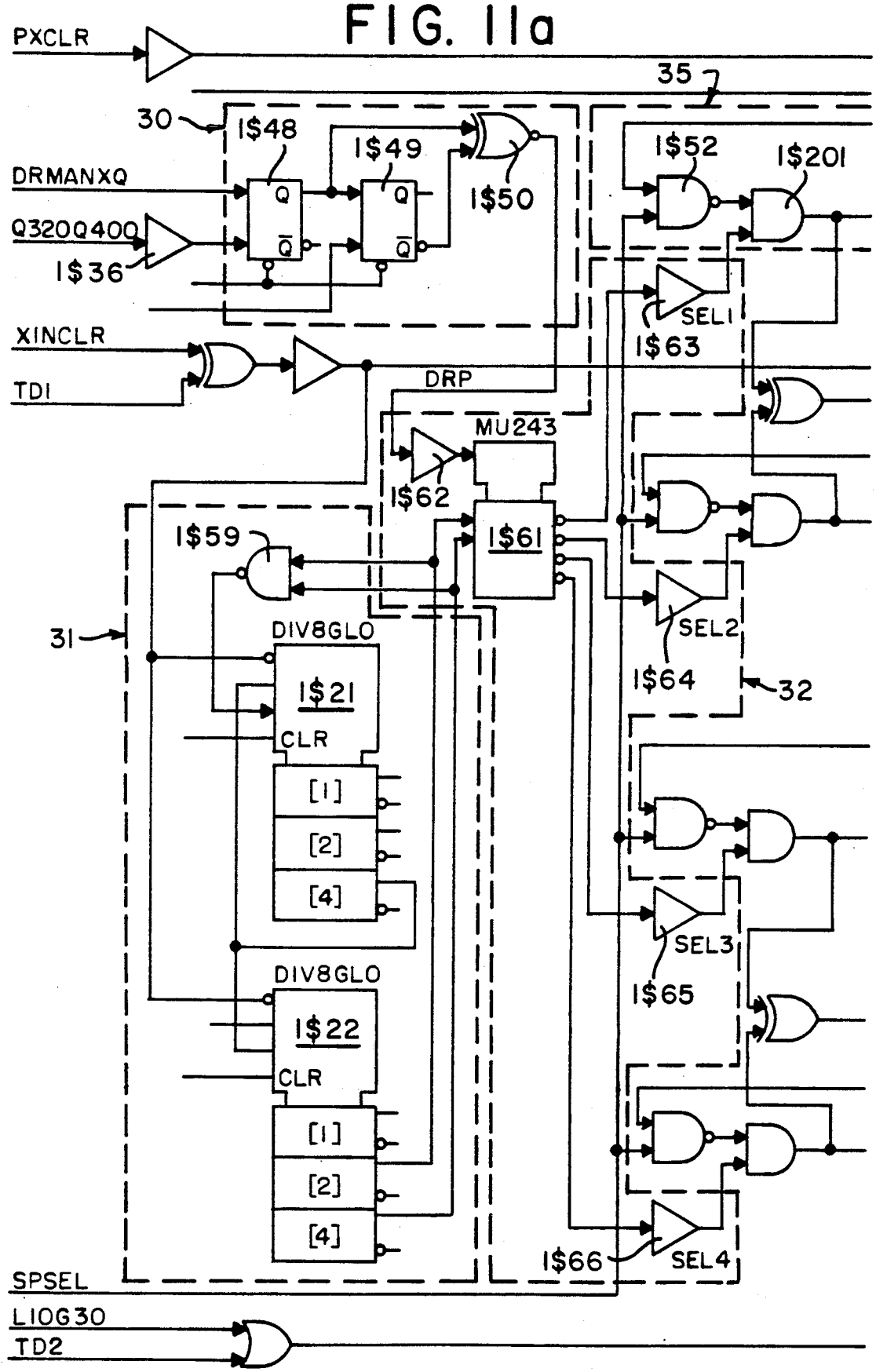
FIGS. 11a, b and c comprise a detailed schematic circuit diagram of the circuit of FIG. 6.

The circuit of FIGS. 11a, b, c is a more detailed schematic of the circuit of FIG. 6 and accomplishes the same functions. The TD1-TD3 inputs and the T11 output of FIG. 11 are used for testing the circuit and are not functionally part of the circuit. The signals TD1-TD3 are considered to be low for purposes of this application.

Figure 11B:
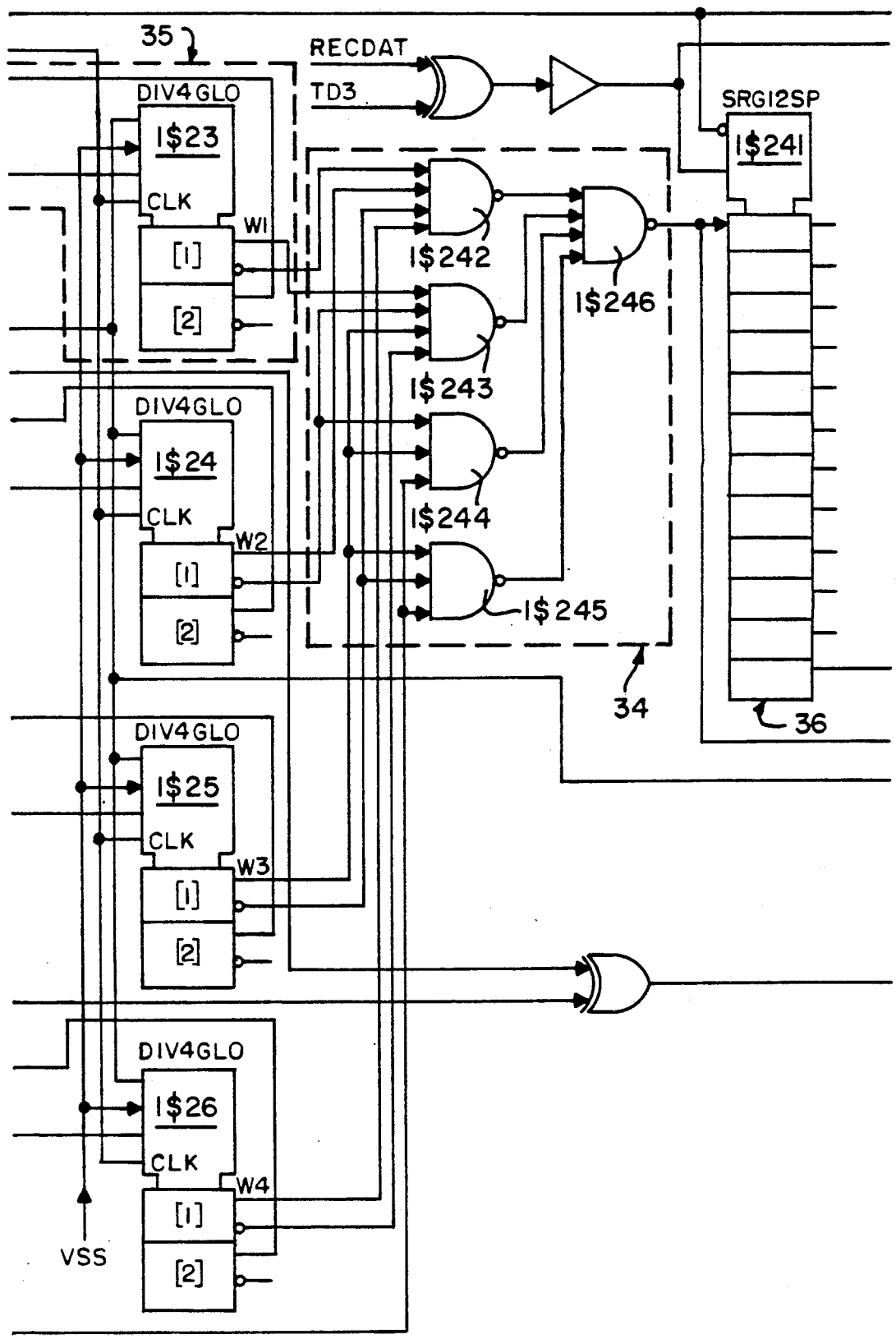
Figure 11C:
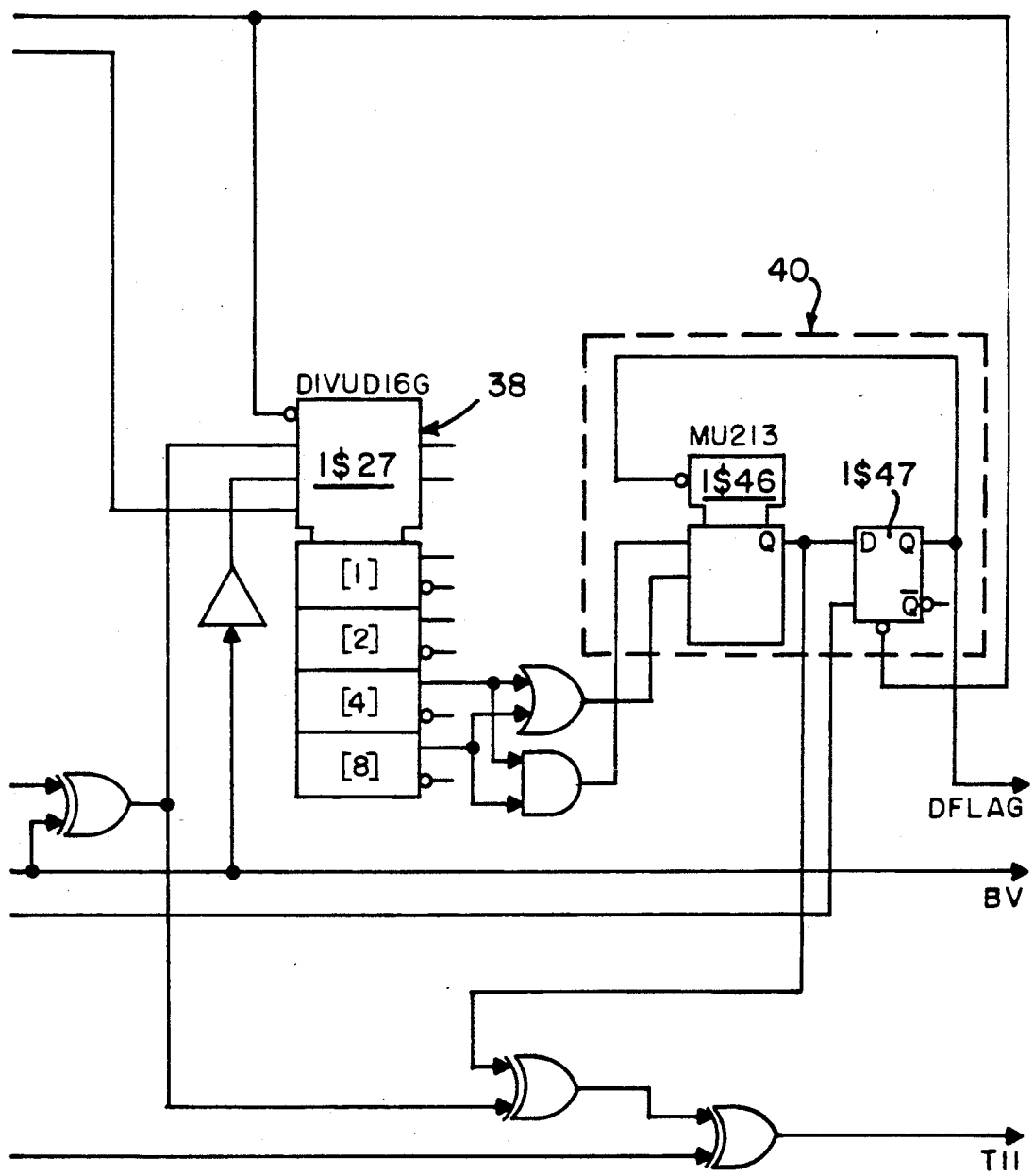

In the detailed circuit (FIGS. 11a-c), the edge detector function 30 is performed by flip-flops I$48,I$49, and Ex-Nor gate I$50. The window counter 31 is created by counters DIV8GLO (I$21, I$22) and Nand gate I$59. The multiplexer function 32 is performed by invertor I$62 and multiplexer MU243(I$61). The SEL1-SEL4 outputs are taken from the inverters I$63 to I$66. Each of the edge counters 35 is comprises of a DIV4GLO counter, a Nand-gate, and one AND-gate. In FIGS. 11a-c, for example, DIV4GLO (I$23), Nand-gate I$52 AND-gate I$201 form the edge counter 35 for window 1, with output W1. The edge counters 35 for the other windows are idential with output Wx, where x is the window number.

The bit valid decoder logic 34 is made up of five Nand-gates I$242-I$246 arranged to operate according to the truth table of FIG. 7. The 12-bit shift register 36 is the shift register SRG12SP (I$241). The 4 bit up/-down counter 38 consists of a 4-bit counter DIVUD16-G(I$27). The DFLAG decoding circuit 40 comprises multiplexer MU213(I$46) and flip-flop I$47.

FIGS. 11a-c differs from FIG. 6 in that the SEL-1-SEL4 signals from multiplexer 32 are not used to directly clock the edge counters 35. In FIGS. 11a-c, the SEL signals enable the edge counters 35, which are then clocked from signal Q320kQ400k. In FIG. 6, the SEL1-SEL4 signals are connected directly to the clock inputs of the edge counters. Because of the edge relationships in the input waveforms there is no difference in function.

With the circuit of FIGS. 11a-c, a data edge near the edge of a window will be decoded in one window or the other, depending on the set up time of the flip-flops I$48, I$49 of the edge detector. The circuit is designed so that the edge can only be in one window. If the signal is perfect and the edge takes place right on the W2-W3 border, then the edge is recorded in W3. An edge on the W4-W1 border is recorded in W1.

Figure 12A:
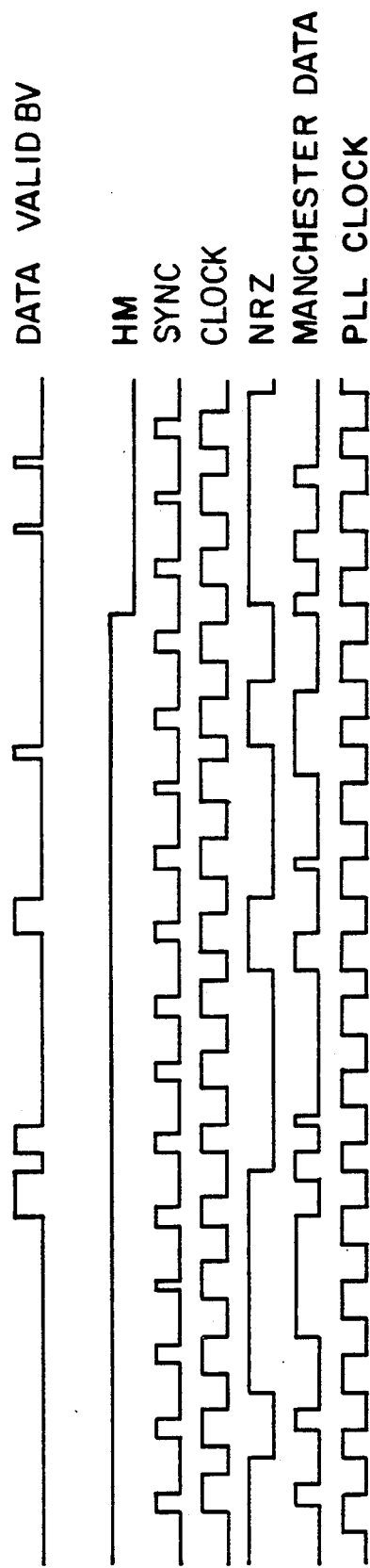
FIGS. 12a and 12b are illustrations of circuit waveforms indicating false detection and valid detection of a synchronization word according to the present invention.
Figure 12B:
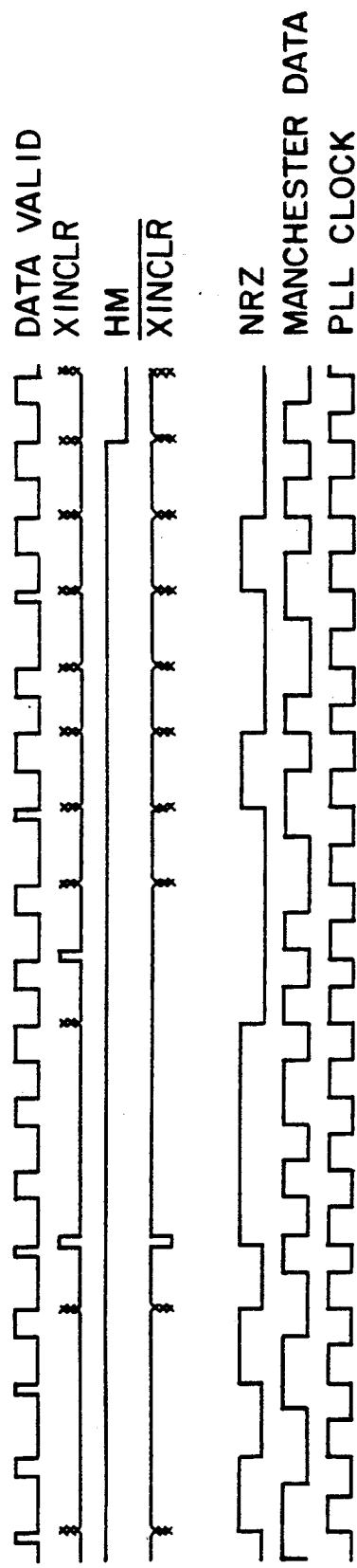

FIGS. 12a and 12b show examples of data detection. In FIG. 12a, only noise was received by a Manchester decoder unit in accordance with the invention. It can be seen that the top signal, i.e. BV, which checks the validity of a bit as discussed above, indicates that only two of the 1 bits were good in the presence of pure noise. FIG. 12b shows an example in which a strong data signal is received. In FIG. 12b the BV signal is high at the end of a bit period of a large number of bits, indicating that a good signal has been received. A third signal, DFLAG (not shown in FIGS. 12a, b), can be used to indicate that a sufficient number of bits are valid. This third signal can then be used to indicate valid data detection.

The HM signal in FIGS. 12a, b goes low when a synchronization sequence has been received. In FIG. 12a the HM signal indicates reception of the synchronization sequence even though only noise has been received. In effect, the noise has been randomly decoded as the sync signal. However, the BV signal prevents the present invention from responding to this false HM signal. In FIG. 12b there are a sufficient number of consecutive BV signals to indicate that the HM signal is correct.

The Manchester data is decoded into NRZ (non return to zero) signals. As a result the NRZ signal is delayed by one bit period from the Manchester data as shown in FIG. 12a, b. It is the decoded NRZ signal which is used by the synchronization word detector (not shown).

The circuit according to the present invention has been found to be useful functionally as well as in other ways, such as reduced cost, when compared to the methods used in the prior art that perform similar functions. The circuit can be implemented by simple digital techniques and is small in size.

When using the method of the present invention to decode Manchester data, a synchronization word detector for a word of N bits will indicate false detection of the word, in the absence of a transmitted signal or in pure noise, assuming equal probability of a 1 or 0, with a probability $1/(2^{}N)$. If the data is transmitted at a rate of x hz, this will be an average of one false detection every $(2^{}N) (1/X)$ seconds. For a synchronization word of 11 bits and a data transmission rate of 10 khz, this is an average of one false detection every 0.2048 seconds.

The data valid-circuit can be used in a high noise environment to determine that the synchronization word was detected erroneously. In an actual circuit the BV signal must be high or 11 bits, or the length of the synchronization word itself, to initially set a DFLAG signal high. This DFLAG signal is then used to check the synchronization word detection before data is sent forward to the processor.

When a data frame is received, the circuit in accordance with the invention may detect valid data during the dotting pattern, synchronization word or both. When valid data is detected before the synchronization word is detected, the DFLAG signal and synchronization word detection signals can be used to indicate that a data frame is being received. The processor can then mute the audio in the phone so that static and noise is not heard in the receiver. The muting can be timed to last the duration of a bit frame. The detection of valid data and the word sync takes approximately 10 microseconds, which is too short a time to be heard at the receiver.

A data-valid circuit has been designed according to the present invention and used in a modem circuit with satisfactory performance using the following parameters: number of windows (W)=4; information bits per window(X)=1; length of bit string(N)=12; number of correct bits necessary to keep a received string valid after word sync is received M2>3; number of correct bits necessary to affirm word sync recognition n=12.

While the invention has been particularly shown and described with reference to preferred embodiments thereof, it will be understood by those skilled in the art that various changes in form and details may be made therein without departing from the spirit and scope of the invention. Such changes and modifications are considered part of the invention, even though they are not expressly set forth herein. It is further intended that all matter contained in the above description and shown in the accompanying drawings be interpreted as illustrative and not in a limiting sense.

What is claimed:

1. A method for determining the validity of Manchester encoded data in the form of electrical signals, having a number of edges, a particular bit period and being in an electrical received signal which may or may not also include data noise, such as speech signals, comprising the steps of:

measuring with an integrator circuit the integral of a received signal pulse that occurs in a bit period in order to obtain an integrator count;

locating with a detector circuit in which portions of the data bit period the edges of the received signal pulse occur in order to obtain edge locations; and determining with a logic circuit whether the received signal pulse in a bit period is valid data depending on the integrator count as compared to the integrator count of a received Manchester data bit unaffected by noise, and depending on the edge locations.

2. A method for determining the validity of Manchester encoded data as claimed in claim 1, wherein the step of locating includes the steps of:

dividing each bit period into W time portions, and counting the number of edges that occur in each time portion.

3. A method for determining the validity of Manchester encoded data as claimed in claims 1 or 2 wherein the step of measuring includes the steps of:

generating a clock signal having a frequency synchronized to said data bit period;

combining said received signal and said clock signal according to an Exclusive-OR logic function to provide an Exclusive-OR signal;

generating a frequency signal having a frequency F times the frequency of said bit period; and counting cycles of said frequency signal depending on said Exclusive-OR signal, the count at the end of a bit period being said integrator count.

4. A method for determining the validity of Manchester encoded data as claimed in claim 3.

further including the steps of producing an integrator signal which is in one state when the integrator count in a bit period exceeds a first predetermined value or is less than a second predetermined value, and is in a second state when the count in a bit period is between the first and second predetermined values; and wherein the step of determining involves comparing a pattern and number of edge locations in the time portions of one bit period and the integrator count against predetermined standards therefor.

5. A method for determining the validity of Manchester encoded data as claimed in claim 1, wherein said received signal is continuous, further comprising the steps of:

assigning a binary value to the received signal in each bit period, said value being one of valid and invalid;

continuously collecting in an N bit shift register the valid/invalid values of N of said bit periods of said received signal in consecutive order;

monitoring the number of valid values present in said N bit register; and creating a two state data-valid signal that indicates in a first state that the continuously received data is valid and in a second state indicating the received data is invalid, based on a comparison of the number of valid values present in said N bit register against a predetermined standard.

6. A method as claimed in claim 5, wherein said predetermined standard requires a data-valid signal to be in the first state indicating good reception of signals when a preselected number of consecutive bit periods provide valid indications.

7. The method as claimed in claim 6, wherein the preselected number is N.

8. A method as claimed in claim 6, wherein said predetermined standard requires that a data-valid signal indicating good reception be maintained so long as at least a predetermined number M of said consecutive values in said N bit register indicate valid values in the received signal.

9. A method as in claim 8, wherein N=11 and M=3.

10. A method for determining the validity of Manchester encoded data in the form of electrical signals having edges, a particular bit period, and being in an electrical received signal, which may or may not include noise, such as speech signals, comprising the steps of:

dividing each bit period of the received signal into W time portions, each time portion being 1/W of the a data bit period in duration;

counting with a first counter circuit the number of edges of the received signal which occur in each respective time portion to determine the location and the number of the edges;

generating a clock signal having a frequency synchronized to said data bit period;

combining said received signal and said clock signal in an Exclusive-OR logic circuit to provide an Exclusive-OR signal which is high for a major portion of the period for a logical 1 bit in the received signal and is low for a major portion of the period for a logical 0 bit;

generating a frequency signal having a frequency F times the frequency of said bit period;

counting with a second counter circuit the cycles of said frequency signal whenever said Exclusive-OR signal is high;

producing an integrator signal when the count in said second counter during a bit period exceeds a first predetermined value or is less than a second predetermined value; and determining with a logic circuit the validity of a signal received during one bit period as a Manchester data bit by comparing the integrator signal and a pattern of the locations and the number of edges of the received signal in said time portions, respectively, against predetermined standards.

11. A method for determining the validity of Manchester encoded data as claimed in claim 10, further comprising the steps of:

assigning a binary value, valid or not valid, to the signal received in each bit period;

continuously collecting in an N bit shift register the assigned value for N of said bit periods in consecutive order as received;

monitoring the number of valid values present in said N bit register; and creating said output signal as a data-valid signal that indicates whether continuously received data is valid or invalid by comparison of the number of valid values present in said N bit register against said predetermined standards.

12. A method as in claim 11, wherein said predetermined standards require that a data-valid signal indicating good reception be maintained so long as more than a predetermined number M of said N consecutive values indicate a valid value in said received signal.

13. A data detector circuit for detecting valid Manchester encoded data in the form of a received signal having a number of edges and fixed bit periods, comprising:

an integrator counter means for numerically determining an integral of a received signal that occurs in a bit period, said integrator counter means generating an integrator count signal corresponding to said integral for each bit period;

window generator means for dividing each bit period into a number of time portions;

window counter means for receiving said received signal and counting the number of received signal edges that occur in each time portion to form edge count signals representative of the number of edges in each time portion; and decoder means for receiving said integrator count signal and edge count signals, and producing a bit valid signal whenever said integrator count signal and said edge count signal satisfy predetermined standards for valid data in respective bit periods.

14. A detector circuit as claimed in claim 13, wherein said window generator means comprises detector means for indicating the presence of edges, if any, in said received signal during a bit period, said detector means producing an edge signal for each edge in the received signal, and divider means for dividing each bit period into W consecutive time portions or windows and producing W separate selection outputs in sequence during a bit period corresponding to each window; and wherein said window counter means comprises at least W counters for counting the edges in each of W windows in a bit period, each counter being connected to receive the edge signals from said detector means by way of one of said selection outputs of said divider means such that counting of edges occurs during a selection output.

15. A detector circuit as claimed in claim 14, wherein said divider means includes a multiplexer directing the edge signals from said edge detector means to a respective edge counter for each time portion, each edge counter providing one of said edge count signals indicative of the number of edges received in the corresponding time portion.

16. A detector circuit as claimed in claim 13, wherein the predetermined standards include ranges of integrator counts and said decoder means changes the range in correspondence with preselected edge count signals.

17. A detector circuit as claimed in claim 13 wherein said Manchester integrator counter means comprises:

generator means for providing a first frequency signal having the same period as said bit period and a second frequency signal that is F times higher in frequency than said first frequency signal;

Exclusive-OR means for logically combining the received signal with the first frequency signal according to an Exclusive-OR logical function to provide an Exclusive-OR signal;

an integrator counter means for counting cycles of said F frequency signal depending on the state of the Exclusive-OR signal during a bit period, the number of cycles counted being the integrator count.

18. A detector circuit as claimed in claims 14 or 17, further comprising accumulator means for continuously storing bit valid signals from said decoder means for N consecutive bit periods, said accumulator means generating a signal of a first state indicating good data reception of signals when N consecutive signals produced by said decoder means indicate valid received data.

19. A detector circuit as claimed in claim 18, further comprising circuit means for changing the state of said accumulator means output when at least M of said N consecutive bit valid signals indicate invalid received data.

20. A detector circuit as claimed in claim 13, wherein the number of time portions is W and said predetermined standards include a correlation between possible combinations of edge location in said W time portions and corresponding ranges for the integrator count, so as to indicate one of invalid data, a received valid 1 bit and a received valid 0 bit for each of said possible combinations.

21. A data detector circuit for detecting valid Manchester encoded data in the form of a received electrical signal having edges with fixed bit periods even in the presence of noise, comprising:

generator means for providing a first frequency signal having the same period as said bit period and a second frequency signal that is F times higher in frequency than said first frequency signal;

first logic means for receiving said received signal and said first frequency signal and for combining the received signal with said first frequency signal according to an Exclusive-OR logic function to produce an Exclusive-OR signal having two states;

integrator counter means for receiving said second frequency signal and counting cycles of said F frequency signal whenever the Exclusive-OR signal is in one of its two states during a bit period, and for said bit period producing an integrator count signal related thereto;

detector means for receiving said received signal and for generating a detector signal indicating the presence of edges, if any, in said received signal during said bit period;

dividing means for dividing said bit period into W consecutive time portions or windows and determining in which window said detected edges, if any, occur, said dividing means including W counter means for counting the edges in each of said W time portions to form edge count signals; and second logic means receiving respective edge count signals from said W counter means indicating the number of edges in each said window and from the integrator counter means indicating the integrator count signal in a bit period, the output of said second logic means indicating one of a (i) valid received signal, said valid signal being either a logical 1 or a logical 0, and (ii) an invalid signal in said bit period, based upon predetermined standards related to combinations of the number and location of edges in said time portions and ranges for the integrator count signal.

22. A detector circuit as in claim 21, further comprising accumulator means for continuously storing the output of said second logic means for N consecutive bit periods, said accumulator means creating a signal with a first state indicating good data reception of signals when N consecutive outputs from said second logic means indicate valid received signals.

23. A detector circuit as claimed in claim 22, further comprising circuit means for changing the state of said accumulator means output when less than M of said N consecutive bits are valid bit signals received from said second logic means.

24. A detector circuit as in claim 21, wherein said W counter means includes W edge counters and said dividing means further includes a multiplexer directing the detector output signal of said detector means, indicating the presence of edges, to a respective edge counter for each time portion, each edge counter providing an edge count signal indicative of the number of edges received in the corresponding time portion.

25. A detector circuit as in claim 24, wherein each edge counter in said dividing means provides an output in one of a first state and an opposite state, said output state being subject to adjustment in response to selected numbers of counted edges.

26. A detector circuit as in claim 21, further comprising means for changing the response of said W counter means to the number of edges in a time portion.

27. A detector circuit as in claim 21, wherein said second logic means selects for each bit period a range of integrator count from said predetermined standards in accordance with the combination of the number and location of edges of the received signal for each said bit period, respectively.

* * * * *

UNITED STATES PATENT AND TRADEMARK OFFICE
CERTIFICATE OF CORRECTION

PATENT NO. : 5,170,396

DATED : December 8, 1992

INVENTOR(S) : Brian T. Rivers, et al.

It is certified that error appears in the above-identified patent and that said Letters Patent is hereby corrected as shown below:

On the title page, item (73) Assignee, should read -- Nokia Mobile Phones Ltd., Salo, Finland.

Signed and Sealed this

Thirteenth Day of April, 1993

Attest:

STEPHEN G. KUNIN

Attesting Officer

Acting Commissioner of Patents and Trademarks